United States Patent [19]
Corl et al.
[11] Patent Number: 5,059,851
[45] Date of Patent: Oct. 22, 1991

[54] MINIATURE ULTRASOUND HIGH EFFICIENCY TRANSDUCER ASSEMBLY, GUIDEWIRE USING THE SAME AND METHOD

[75] Inventors: Paul D. Corl, Palo Alto; Ilan Lifshitz, Mountain View; Jeffrey J. Christian, San Jose; Menahem F. Nassi, Palo Alto, all of Calif.

[73] Assignee: Cardiometrics, Inc., Mountain View, Calif.

[21] Appl. No.: 579,074

[22] Filed: Sep. 6, 1990

[51] Int. Cl.5 .............................................. H01L 41/08

[52] U.S. Cl. .................................... 310/334; 310/369; 128/657; 128/658; 128/772

[58] Field of Search .............................. 310/334, 369; 128/656–657, 658, 772

[56] References Cited

U.S. PATENT DOCUMENTS

| | | | |
|---|---|---|---|
| 3,430,625 | 3/1969 | McLeod | 310/334 |
| 3,827,115 | 8/1974 | Bom | 310/334 |
| 4,316,115 | 2/1982 | Wilson et al. | 310/334 |
| 4,958,642 | 9/1990 | Christian et al. | 128/772 |
| 4,961,433 | 10/1990 | Christian | 128/772 |
| 4,967,753 | 11/1990 | Haase et al. | 128/772 |
| 4,991,588 | 2/1991 | Pflueger et al. | 128/662 |

*Primary Examiner*—Mark O. Budd
*Assistant Examiner*—Thomas M. Dougherty
*Attorney, Agent, or Firm*—Flehr, Hohbach, Test, Albritton & Herbert

[57] ABSTRACT

Guidewire comprising a flexible elongate member having a distal extremity with an ultrasonic transducer secured to the distal extremity of the flexible elongate member. The transducer has a diameter ranging from 0.007 inches to 0.018 inches and has a thickness and a diameter to provide a transducer having an aspect ratio with a thickness which is one-half of the diameter ±5%. Electrical leads are connected to the transducer and extend the length of the flexible elongate member.

20 Claims, 1 Drawing Sheet

MINIATURE ULTRASOUND HIGH EFFICIENCY TRANSDUCER ASSEMBLY, GUIDEWIRE USING THE SAME AND METHOD

This invention relates to an ultrasonic transducer assembly, a guidewire using the same and method and more particularly to a micro-miniature ultrasound high efficiency transducer assembly.

Heretofore guidewires have been provided with ultrasonic transducers mounted on the distal extremities of the same. However, it has been found that when the diameters of such ultrasonic transducers have been reduced in size, particularly in diameter, there is an unacceptable degradation of the performance of the transducers which is substantially greater than the proportional reduction in size of the emitting area of the transducer. There is therefore a need for an ultrasonic transducer which has a high efficiency even though it has been reduced to a micro miniature size.

In general, it is an object of the present invention to provide a miniature ultrasound high efficiency transducer assembly, a guide wire for using the same and method.

Another object of the invention is to provide a transducer assembly of the above character in which the transducer material has a high electro-mechanical coupling coefficient and a high dielectric constant.

Another object of the invention is to provide a transducer assembly of the above character in which the transducer has an aspect ratio of 2:1.

Another object of the invention is to provide a transducer assembly of the above character in which the transducer is air-backed.

Another object of the invention is to provide a transducer assembly of the above character in which a matching layer is provided.

Another object of the invention is to provide a transducer assembly of the above character in which the transducer has a diameter ranging of 0.018 inches or less.

Another object of the invention is to provide a transducer assembly of the above character in which the aspect ratio for the transducer is selected to suppress interaction between the desired thickness mode of vibration and the undesired lateral mode of vibration.

Another object of the invention is to provide a transducer assembly of the above character which is in the form of an annulus.

Additional objects and features of the invention will appear from the following description in which the preferred embodiments are set forth in detail in conjunction with the accompanying drawings.

Figure 1:
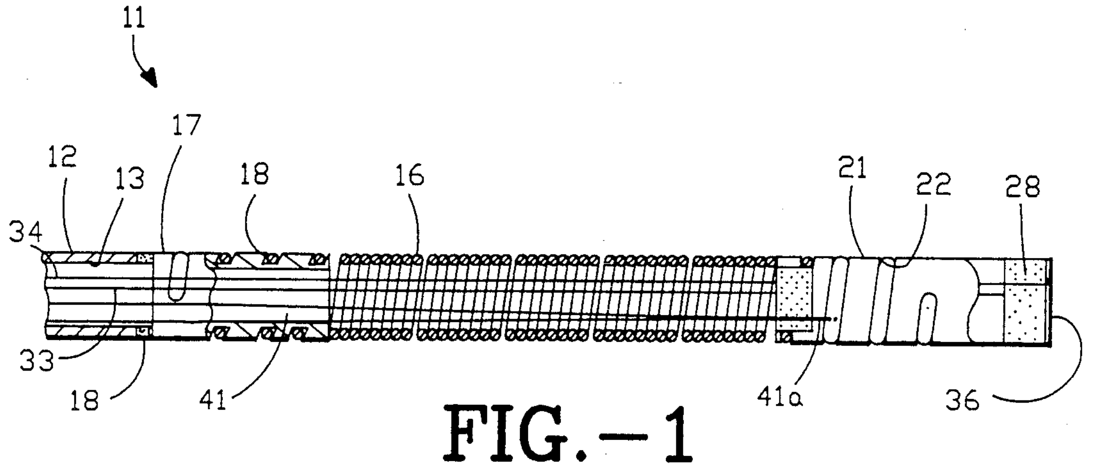
FIG. 1 is a side elevational view of the distal extremity of a guidewire incorporating the present invention having a transducer assembly mounted on the distal assembly also incorporating the present invention.

In general, the guidewire is comprised of a flexible elongate member having a distal extremity. A transducer is secured to the distal extremity. The transducer has an aspect ratio of 2:1 plus or minus 5% with the thickness of the transducer being one-half of the width for a transducer having a diameter ranging from 0.007 inches to 0.018 inches. The transducer has front and back sides. Electrical leads are connected to the front and back sides of the transducer and extend the length of the guidewire. If desired, a matching layer can be provided on the front side of the transducer.

More in particular as shown in the drawings, the guide wire 11 is comprised of a flexible elongate member 12 in the form of a stainless steel tube, typically called a hypo tube which has a suitable length as, for example 150 centimeters. The flexible elongate member 12 can have a suitable diameter ranging from 0.018 inches to 0.010 inches. The flexible elongate member 12 is provided with a cylindrical passageway 13 extending the length thereof. The distal extremity of the flexible elongate member 12 is secured to the proximal extremity of a coil spring 16 in a suitable manner such as by the use of a screw member 17 of the type described in co-pending application Ser. No. 411,339 filed Sept. 22, 1989. The screw member 17 is secured to the flexible elongate member 12 by suitable means such as solder (not shown) at 18. The proximal extremity of the spring 16 is secured to the screw member 17 by threading the same into threads 19 provided in the screw member. A cylindrical screw tip 21 is secured to the distal extremity of the coil spring 16 by threading the coil spring 16 into threads 22 provided on the screw tip 21. It is preferable that the coil spring 16 be formed of a suitable radiopaque material such as a palladium alloy.

The distal extremity of the screw tip 21 is provided with a cup-shaped recess 26. The screw tip 21 can have an outside diameter ranging from 0.018 inches to 0.010 inches. The cup can have a wall thickness ranging from 0.0005 to 0.0015 inches. An ultrasonic transducer 28 is mounted in the cup-shaped recess 26. The wall thickness for the cup ranges from 0.005 inches to 0.0015 inches, the cup 26 would have an inside diameter ranging from 0.007 inches to 0.017 inches and the transducer or crystal 28 would have a diameter ranging from 0.0068 inches to 0.0168 inches. The transducer 28 is mounted within the cup-shaped recess 26 in a suitable manner such as by a medical grade adhesive such as FMD 14 adhesive manufactured by Loctite Corporation. The transducer 28 is provided with front and back surfaces 31 and 32 which are electrically connected to conductors 33 and 34 respectively which extend rearwardly through the screw tip 21, and through the coil spring 16 and through the length of the flexible elongate member 12.

Figure 2:
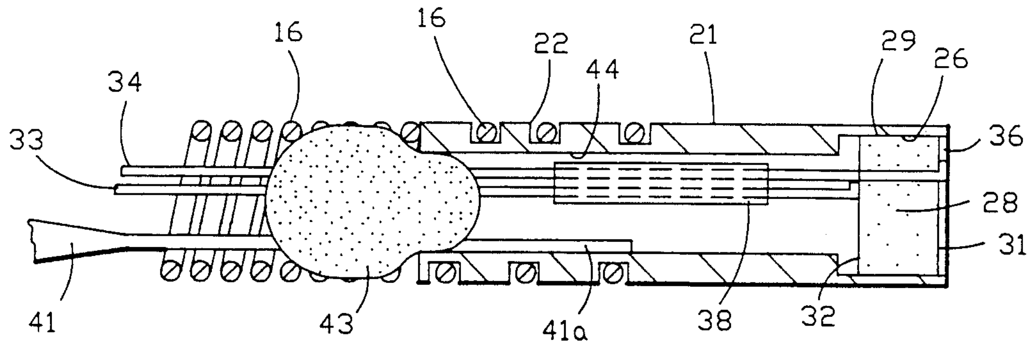
FIG. 2 is an enlarged cross sectional view of the distal extremity of the portion of the guidewire shown in FIG. 1.

As shown in FIG. 2, the transducer 28 is recessed within the cup a suitable distance as, for example, 0.0018 inches so that a matching layer 36 can be provided. The matching layer 36 can have a suitable thickness as, for example, one quarter of the wavelength frequency for the transducer 28. The matching layer 36 can be formed in a number of ways. It can be provided by filling the space in front of the front surface 31 of the transducer 28 with a suitable epoxy material, such as a two part epoxy material manufactured by Dexter Hysol of City of Industry, Calif. After the PC 12 adhesive has cured, it is ground so that it has a surface which is parallel to the front surface 31 of the transducer crystal 28 within ±0.0001 inches to provide a matching layer which is one quarter of the wavelength of the sound wave that is to be propagated by the crystal or transducer 28. If desired, the matching layer 36 also can be formed during the time a Paralene coating is placed on the guidewire as hereinafter described. A small tube 38 of a suitable material, such as a No. 40 polymide is placed over the conductors 33 and 34 immediately to the rear of the back surface 32 to protect the leads from heat during the time that the leads are being bonded or soldered to the front and back surfaces 31 and 32 of the transducer 28.

A tapered core wire 41 of a conventional type formed of a suitable material such as stainless steel extends the length of the flexible elongate member 12 and has its distal extremity 41*a* bonded to the screw tip 21 in a suitable manner such as by solder (not shown).

In order to ensure that the back side of the crystal or transducer 28 is air backed, the proximal extremity of the screw tip 21 is sealed in a suitable manner such as by the use of a bolus 43 of a conventional ultraviolet cured adhesive. As shown in FIG. 2, the transducer 28 is positioned approximately midway in the recess 26 and thus the entire backside of the crystal or transducer 28 is disclosed to the air within the sealed cylindrical recess 44 provided within the screw tip 21.

In order to obtain high efficiency from the micro miniature transducers 28 utilized in the guide wires of the present invention, it has been found that it is desirable to provide the transducer 28 with a suitable aspect ratio. In this connection it has been found that it is desirable to have an aspect ratio of 2:1±10% with the area which is typically the front surface 31 having a diameter or width which can be identified as $\lambda$ and with the thickness of the transducer being one-half of that dimension or in other words one-half $\lambda$.

Piezoelectric materials suitable for use as ultrasonic transducers in connection with the present invention are piezoelectric ceramics. One found to be particularly satisfactory is EC-98 lead magnesium niobate available from EDO Corporation/Western Division/Ceramics Division 2645 South 300 West, Salt Lake City, Utah 84115. The EC-98 composition provides a high dielectric constant, low aging rates, excellent coupling and a high strain constant which makes it suitable for use in micro miniature devices. Another suitable material is PZT-5H supplied by the Verniton Piezoelectric Division, 232 Forbes Road, Bedford, Ohio 44146.

It has been found that the frequency constant for the EC-98 material is 82 megahertz per mil of thickness of the transducer material. Thus for EC-98, the frequency can be established from the following equation:

$$f = \frac{82}{T}$$

where T is the thickness of the crystal in mils.

Thus, knowing the diameter of the crystal or transducer which can range from 0.007 to 1.018 inches, the thickness to obtain the 2:1 aspect ratio would have to range from 0.0035 to 0.009 inches. Assuming, by way of example, that it is desired that the screw tip 31 have an outside diameter of 0.018 inches and that the wall thickness of the screw tip forming the cup-like recess 26 is a minimum of 0.0005 inches which must be multiplied by 2 for the thickness of both walls. At a minimum the crystal would have a diameter of 0.0168 inches (0.018–0.001 and 0.0002 for the adhesive) and dividing this in half to obtain the proper aspect ratio gives a desired thickness of 0.0084 inches which is equivalent to 8.4 mils. Dividing 8.4 mils into 82 gives an operating frequency of 9.76 megahertz which is very close to a desired operating frequency of approximately 10 megahertz.

The instrument which is utilized to drive the transducer can then be designed for such an operating frequency or alternatively, the size of the transducer can be modified slightly to match the desired operating frequency of the instrument. Thus, rather than matching the frequency of the instrument to the transducer, the transducer can be sized so that it will have an operating frequency which matches that of the instrument. With a crystal approaching the smallest possible desired dimension of 0.0068 inches, which divided in half to obtain desired aspect ratio provides a thickness of 0.0034 inches. This divided into 82 megahertz for the frequency constant gives an operating frequency of 24.1 megahertz. The instrument then can be designed to that frequency or the size of the crystal can be varied slightly to accommodate the operating frequency of the instrument.

By utilizing these criteria, it has been found that it is possible to produce a micro-miniature ultrasound high frequency efficiency transducer and a guidewire utilizing the same. The air backing provided for the transducer 28 ensures that substantially all the energy will be directed forwardly through the front surface 31. The use of the matching layer 36 ensures efficient coupling of the energy from the transducer into the surrounding liquid medium (e.g., blood). By utilizing the proper aspect ratio, it has been found that it is possible to obtain a dramatic increase in efficiency over that which would be obtained if the aspect ratio were not maintained. That is, round trip efficiency using an optimal aspect ratio can be greater than ten times the efficiency obtained without optimizing the aspect ratio.

It has hereinbefore been pointed out that Paralene can be utilized for forming the matching layer 36 if desired. In order to provide a Paralene coating for the matching layer which is of sufficient thickness, the screw tip 21 can be initially masked so that the Paralene coating is only applied to the front surface 31. Thereafter, the masking can be removed so that a thin layer of Paralene coating is provided on the screw tip 21 and the coil spring 16 to provide a protective conformal coating, as for example, 1/10th of a mil to insulate the conductive wires 33 from the fluid media, such as blood in which the guide wire is utilized.

Figure 3:
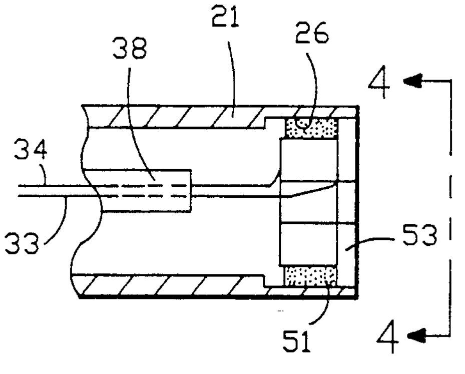
FIG. 3 is a partial cross-sectional view of the distal extremity of another guidewire incorporating the present invention.
Figure 4:
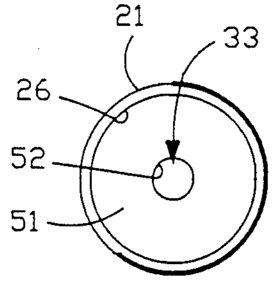
FIG. 4 is an end elevational view of the guide wire shown in FIG. 3 looking along the line 4—4 of FIG. 3.

In accordance with the present invention, the transducer 28 has been described principally as a cylindrical member or disk. It should be appreciated that if desired, a doughnut-shaped transducer 51 can be provided in the recess 26 as shown in FIGS. 3 and 4 in which a hole 52 is provided in the center of the transducer 51 to provide an annulus. The hole 52 can be formed in a suitable manner such as by a diamond drill or a laser. In such a case, the aspect ratio hereinbefore described would have to be reconsidered because of the presence of the hole 52. In such a situation, the annulus would have a much smaller width and therefore an appropriate aspect ratio would be the ratio of 0.5 to 1 rather than 2 to 1 for the disk or cylindrically shaped transducer 28. In other words, the width of the annulus, i.e., the distance from the outer circumference to the outer margin of the hole 52 would be approximately ¼th to ⅓rd of the width extending across the entire annulus or doughnut-shaped member. A matching layer 53 is provided on the front surface of transducer 51. The conductors 33 and 34 are secured to the transducer 51 by having the conductor 33 extend through the hole 52 and soldered to the front surface of the transducer 51 and the conductors 34 soldered to the back surface of the transducer 51.

What is claimed is:

1. A guidewire comprising a flexible elongate member having a distal extremity an ultrasonic transducer secured to the distal extremity of the flexible elongate member, the transducer having a diameter ranging from 0.007 inches to 0.018 inches and having a thickness and a diameter to provide a transducer having an aspect ratio with a thickness which is one-half of the diameter ±5% and electrical leads connected to the transducer and extending the length of the flexible elongate member.

2. A guidewire as in claim 1 wherein the transducer has front an back sides together with a matching layer disposed on the front side.

3. A guidewire as in claim 1 together with a cylindrical member mounted on the distal extremity of the flexible elongate member and housing the transducer and wherein said member is provided with an air space which is behind the transducer so that the transducer is airbacked.

4. A guidewire as in claim 2 wherein said transducer is formed of a piezoelectric ceramic and has a frequency of operation from approximately 9 to 24 megahertz.

5. A guidewire as in claim 3 wherein said cylindrical member is provided with a cup-shaped recess and wherein said transducer is mounted in said cup-shaped recess together with adhesive means for retaining said transducer in said cup-shaped recess.

6. A guidewire as in claim 5 wherein said matching layer is disposed in said cup-shaped recess.

7. In a micro-miniature ultrasonic transducer assembly, a cylindrical member having a cup-shaped recess therein, a piezoelectric ceramic transducer mounted in the recess, said transducer having a diameter of less than 0.018 inches and having an aspect ratio of 2:1±5% with respect to the diameter and thickness of the transducer.

8. A transducer assembly as in claim 7 wherein said transducer has front and back sides together with conductive leads connected to the front and back sides of the transducer and wherein said member is provided with an air space adjacent the back side of the transducer and means sealing the air space on the back side of the transducer so that the transducer is air backed.

9. A transducer as in claim 7 together with a matching layer formed on the front surface of the transducer.

10. A transducer assembly as in claim 7 wherein said transducer has an operating frequency from 9 to 24 megahertz.

11. A guidewire comprising a flexible elongate member having a distal extremity, an annular ultrasonic transducer having a centrally disposed hole therein and being secured to the distal extremity of the flexible elongate member, the transducer being in the form of a annulus having a diameter ranging from 0.007 inches to 0.018 inches and having a centrally disposed hole therein and having a thickness and a dimension from the hole to the outer margin of the annulus to provide a dimension which is approximately one-half of the thickness and electrical leads connected to the transducer and extending the length of the flexible elongate member.

12. A guidewire as in claim 11 wherein the transducer has front and back sides together with a matching layer disposed on the front side.

13. A guidewire as in claim 11 together with a cylindrical member mounted on the distal extremity of the flexible elongate member and housing the transducer and wherein said member is provided with an air space which is behind the transducer so that the transducer is airbacked.

14. A guidewire as in claim 12 wherein said transducer is formed of a piezoelectric ceramic and has a frequency of operation from approximately 9 to 24 megahertz.

15. A guidewire as in claim 13 wherein said cylindrical member is provided with a cup-shaped recess and wherein said transducer is mounted in said cup-shaped recess together with adhesive means for retaining said transducer in said cup-shaped recess.

16. A guidewire as in claim 15 wherein said matching layer is disposed in said cup-shaped recess.

17. In a micro-miniature ultrasonic transducer assembly, a cylindrical member having a cup-shaped recess therein, an annular piezoelectric ceramic transducer of a diameter of less than 0.018 inches in the form of an annulus mounted in the recess, said transducer having a centrally disposed hole therein and having an aspect ratio of 0.5 to 1±5% with respect to the dimension from the hole to the outer margin of the annulus and thickness of the transducer.

18. A transducer assembly as in claim 17 wherein said transducer has front and back sides together with conductive leads connected to the front and back sides of the transducer and wherein said member is provided with an air space adjacent the back side of the transducer and means sealing the air space on the back side of the transducer so that the transducer is air backed.

19. A transducer as in claim 17 together with a matching layer formed on the front surface of the transducer.

20. A tranducer assembly as in claim 17 wherein said transducer has an operating frequency from 9 to 24 megahertz.

* * * * *

UNITED STATES PATENT AND TRADEMARK OFFICE
CERTIFICATE OF CORRECTION

PATENT NO. : 5,059,851

DATED : October 22, 1991

INVENTOR(S) : Paul D. Corl, et al

It is certified that error appears in the above-indentified patent and that said Letters Patent is hereby corrected as shown below:

At column 1, line 40, Cancel "ranging" and substitute therefor --range--

At column 2, line 45 Cancel the bold type "14" and substitute therefor standard type "14"

At column 2, line 38, Cancel "0.005 inches" and substitute therefor --0.0005 inches--

At column 2, line 45, After "adhesive" insert --29--

At column 2, line 62, Cancel the bold type "12" and substitue therefor standard type "12"

At column 3, line 3, Cancel "polymide" and substitute therefor --polyimide--

At column 3, line 55, Cancel "1.018 inches" and substitute therefor --0.018 inches--

At column 3, line 58, Cancel "31" and substitute therefor --21--

UNITED STATES PATENT AND TRADEMARK OFFICE

CERTIFICATE OF CORRECTION

PATENT NO. : 5,059,851

DATED : October 22, 1991

INVENTOR(S) : Paul D. Corl, et al

It is certified that error appears in the above-indentified patent and that said Letters Patent is hereby corrected as shown below:

At column 3, line 62, Cancel "walls. At a minimum" and substitute therefor --walls, at a maximum,--

At column 3, line 67, Cancel the bold type "82" and substitute therefor standard type "82"

At column 4, lines 44-45, Cancel "conductive wires 33" and substitute therefor --conductors 33 and 34--

At column 4, line 52, Cancel the bold type "1" and substitute therefor standard type "51"

At column 5, line 1, Cancel "conductors" and substitute therefor --conductor--

At column 5, line 5, After "extremity" insert --,--

Signed and Sealed this

Twenty-fourth Day of August, 1993

Attest:

BRUCE LEHMAN

*Attesting Officer*

*Commissioner of Patents and Trademarks*